US010515170B1

(12) United States Patent
Kundu et al.

(10) Patent No.: US 10,515,170 B1
(45) Date of Patent: Dec. 24, 2019

(54) DEEP INSIGHT FOR DEBUG USING INTERNAL EQUIVALENCE VISUALIZATION AND COUNTER-EXAMPLE FOR SEQUENTIAL EQUIVALENCE CHECKING

(71) Applicant: Synopsys, Inc., Mountain View, CA (US)

(72) Inventors: Sudipta Kundu, Hillsboro, OR (US); Per Bjesse, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 1 day.

(21) Appl. No.: 16/034,279

(22) Filed: Jul. 12, 2018

Related U.S. Application Data

(60) Provisional application No. 62/531,587, filed on Jul. 12, 2017.

(51) Int. Cl.
*G06F 17/50* (2006.01)
*G06F 16/901* (2019.01)

(52) U.S. Cl.
CPC ........ *G06F 17/504* (2013.01); *G06F 16/9027* (2019.01); *G06F 17/5027* (2013.01); *G06F 17/5036* (2013.01); *G06F 17/5045* (2013.01)

(58) Field of Classification Search
CPC .............. G06F 17/504; G06F 17/5045; G06F 16/9027; G06F 17/5036; G06F 17/5027
See application file for complete search history.

(56) References Cited

U.S. PATENT DOCUMENTS 6,247,163 B1  6/2001  Burch et al.
8,914,758 B1  12/2014  Kundu et al.
8,918,747 B2 * 12/2014 Boersma ............. G06F 11/2273
                                                   716/106
2015/0074624 A1 * 3/2015 Kailas ................. G06F 17/5068
                                                   716/107
2016/0224714 A1 * 8/2016 Bencivenga .......... G06F 17/504
2016/0328506 A1 * 11/2016 Shupe ................. G06F 17/5045

OTHER PUBLICATIONS

VC Formal—Next Generation Formal Vierification—Datasheet, Synopsys, Inc., May 22, 2018, 4 pages.
JasperGold Sequential Equivalence Checking App, https://www.cadence.com/content/cadence-www/global/en_US/home/tools/system-design-and-verification/formal-and-static-verification/jasper-gold-verification-platform/jaspergold-sequential-equivalence-checking-app.html, Cadence Design Systems, Inc., Dec. 19, 2018, accessed Jul. 12, 2018, 2 pages.

* cited by examiner

*Primary Examiner* — Stacy Whitmore
(74) *Attorney, Agent, or Firm* — Haynes Beffel & Wolfeld LLP

(57) ABSTRACT

Disclosed is a technology for parallelized design verification of two circuit designs at a register transfer level. A plurality of potential equivalent sub-circuit pairs is identified from the circuit designs to create a proof-tree structure. The proof-tree structure includes a root-proof, a plurality of parent-proofs downchain of said root-proof and a plurality of child-proofs downchain of at least one of the parent-proofs. Each one of the child-proofs is associated with a first equivalency status of one of the potential equivalent sub-circuit pairs. The parent-proofs are associated with second equivalency statuses dependent upon the first equivalency statuses of downchain child-proofs. The root-proof is associated with a third functional equivalency status of the two circuit designs dependent upon the second equivalency statuses of downchain parent-proofs. This Abstract is not intended to limit the scope of the claims.

20 Claims, 14 Drawing Sheets

| VpId | Name | Proof Type | Upchain | #Assertion | #Constraint | Status | % |
|---|---|---|---|---|---|---|---|
| 0 | top | root | nil | 2 | 3 | inconclusive | 50 |
| 1 | top-abs | Parent-abstract | top | 0 | 0 | - | - |
| 2 | ch1 | child | top-abs | 4 | 3 | failure | 100 |

| VpId | Name | Proof Type | Upchain | #Assertion | #Constraint | Status | % |
|---|---|---|---|---|---|---|---|
| 0 | top | root | nil | 2 | 3 | failure | 100 |
| 1 | top-abs | Parent-abstract | top | 0 | 0 | - | - |
| 2 | ch1 | child | top-abs | 4 | 3 | failure | 50 |
| 3 | ch2 | child | top-abs | 3 | 3 | failure | 100 |

| VpId | Name | Proof Type | Upchain | #Assertion | #Constraint | Status | % |
|---|---|---|---|---|---|---|---|
| 0 | top | root | nil | 2 | 3 | success | 100 |
| 1 | top-abs | Parent-abstract | top | 0 | 0 | success | - |
| 2 | ch1 | child | top-abs | 4 | 3 | failure | 100 |
| 3 | ch2 | child | top-abs | 3 | 3 | success | 100 |

FIG. 3

| VpId | Name | Proof Type | Upchain | Assertion | Constraint | Status | % |
|---|---|---|---|---|---|---|---|
| 0 | top | root | nil | 2 | 3 | success | 100 |
| 1 | top-nabs | Parent-non-abstract | top | 0 | 0 | success | - |
| 2 | ch1 | child | top-nabs | 1 | 3 | success | 100 |
| 3 | ch2 | child | top-nabs | 1 | 3 | success | 100 |

FIG. 4A

| VpId | Name | Proof Type | Upchain | Assertion | Constraint | Status | % |
|---|---|---|---|---|---|---|---|
| 0 | top | root | nil | 2 | 3 | failure | 100 |
| 1 | top-nabs | Parent-non-abstract | top | 0 | 0 | failure | - |
| 2 | ch1 | child | top-nabs | 1 | 3 | failure | 100 |
| 3 | ch2 | child | top-nabs | 1 | 3 | success | 100 |

FIG. 4B

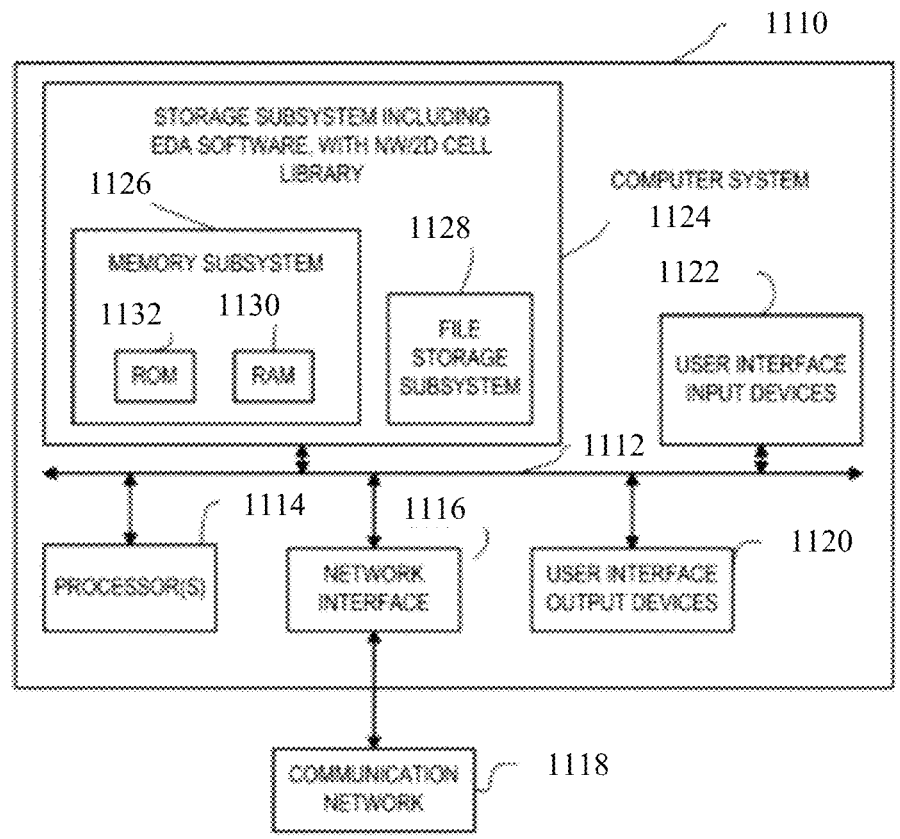
FIG. 11A
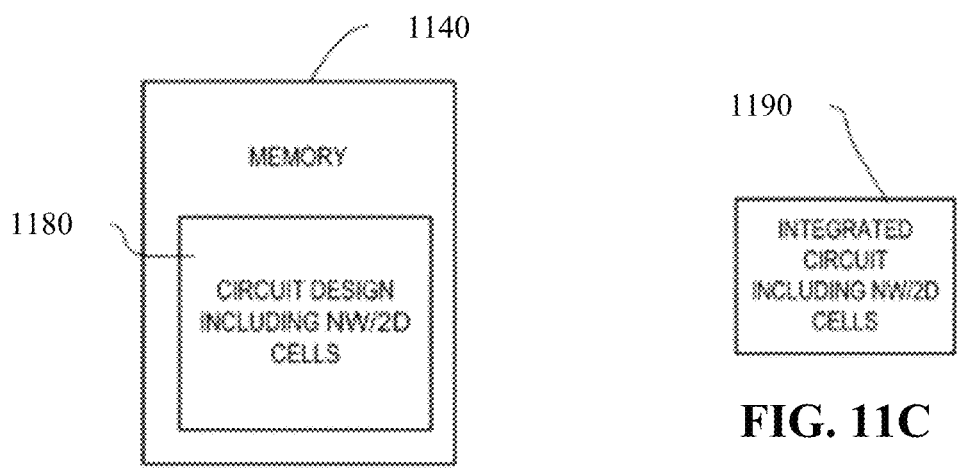
FIG. 11B
FIG. 11C

DEEP INSIGHT FOR DEBUG USING INTERNAL EQUIVALENCE VISUALIZATION AND COUNTER-EXAMPLE FOR SEQUENTIAL EQUIVALENCE CHECKING

CROSS-REFERENCE TO RELATED APPLICATIONS

This application claims priority under 35 U.S.C. § 119(e) to U.S. Provisional Application No. 62/531,587 filed on Jul. 12, 2017, the entire contents of which are hereby incorporated by reference herein.

FIELD OF THE INVENTION

This invention relates to the modeling of semiconductor circuits in computer-aided design (CAD) and electronic design automation (EDA) systems, and more specifically to verification of semiconductor circuit designs.

COPYRIGHT NOTICE

A portion of the application contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

DISCLAIMER

In the following Background, Summary, and Detailed Description, headings should not be construed as necessarily limiting. In the following Background, Summary and Detailed Description, the citation or identification of any publication does not signify relevance or status as prior art for any of the claimed or described embodiments.

STATEMENT REGARDING PRIOR DISCLOSURES BY THE INVENTOR OR A JOINT INVENTOR UNDER 37 C.F.R. 1.77(B)(6)

A prior developed verification tool for integrated circuits "Synopsys VC Formal" was released as a product by Synopsys, Inc. in September 2016. The verification tool utilizes technical features, and system programming disclosed herein. A data sheet for the verification tool is provided in an Information Disclosure Statement, filed pursuant to the guidance of Examination Guidelines for Implementing the First Inventor To File Provisions of the Leahy-Smith America Invents Act, 78 Fed. Reg. 11059, 11076 middle column (Feb. 14, 2013).

BACKGROUND

Modern integrated circuits (ICs) are often very large and complex, and may be built from tens or even hundreds of millions of transistors, making these systems difficult and expensive to design and validate. Market demands may require ICs to possess ever-increasing performance, advanced feature sets, system versatility, and a variety of other rapidly changing system specifications. These demands often introduce contradictory design requirements into the design process. Circuit designers are required to make significant tradeoffs in performance, physical size, architectural complexity, power consumption, heat dissipation, fabrication complexity, and cost, among others, to try to meet design requirements best. Each design decision exercises a profound influence on the resulting IC. To handle such IC complexity, designers create specifications and design ICs around the specifications. The specifications attempt to balance the many disparate demands being made of the ICs and contain the ever-increasing design complexity.

The process of comparing proposed designs to the specifications around which they were constructed helps ensure that the designs meet critical IC objectives. The process of comparing two or more designs is called verification. Logic systems may be described at a variety of levels of abstraction, from low-level transistor layouts to high-level description languages. Circuit designers can describe and design their ICs at a high-level of abstraction using an IEEE Standard hardware description language (HDL) such as Verilog™, SystemVerilog™, or VHDL™ Often, a high-level HDL is easier for designers to understand, especially for a vast system, as the high-level HDL may describe highly complex concepts that are difficult to grasp using a lower level of abstraction. An HDL description may be converted into another, lower level of abstraction if helpful to the circuit designers. For example, a high-level description may be converted to a logic-level description such as a register-transfer level (RTL), a gate-level (GL) description, a layout-level description, or a mask-level description. Each lower level of abstraction introduces more detail into the design description.

Circuit designs of ICs can be optimized at a lower level of abstraction than high-level HDL, such as RTL, in order to reduce the time-to-market of ICs. During optimizations at RTL, two or more circuit designs can be compared to verify that the designs exhibit identical functional behavior. Sequential Equivalence Checking (SEC) is a technique designed to compare two circuit designs and verify that they are equivalent on a cycle-by-cycle basis. A variety of advanced techniques, such as black-boxing and abstract logic models, can be deployed to overcome the resource constraints and the fundamental limitation of formal algorithms, and simplify the SEC. For a given SEC setup, there are three possible outcomes: (i) the designs are verified to be equivalent based on the given setup, (ii) the designs were not equivalent, and (iii) the verification was inconclusive. When the designs are not equivalent, the circuit designer may try to debug a counter-example generated by the SEC setup and identify the possible cause of the differences in the designs. If verification of the designs were inconclusive, the user might be required to identify the potential regions in the circuit designs that may be causing the differences.

An SEC setup of a first circuit design and a second circuit design can be broken into multiple potential equivalent sub-circuit pairs at a register transfer level where each pair identifies with a sub-circuit of the first design and a sub-circuit of the second design. The sub-circuits of the first and second designs have similar functionality and variables of interest (observables such as inputs and outputs) at RTL. The potential equivalent sub-circuit pairs can be identified by their relative position with respect to the time domain (clock cycles), or their position in the space domain of the two circuit designs. The multiple potential equivalent sub-circuit pairs can be sequentially compared, making the SEC process a time-consuming and complex project.

It is therefore desirable to provide SEC system that verifies the two circuit designs in a methodical and time-efficient way, thereby, improving the quality of debugging and ability to pinpoint the exact locations of the design differences. It is also desirable to provide the circuit designers with an activity viewer that dynamically tracks the SEC process.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

Roughly described, a system and a method are provided that can improve the process of sequential equivalence checking of a first circuit design and a second circuit design at a register transfer level. The system identifies a plurality of potential equivalent sub-circuit pairs at a register transfer level where each pair identifies a sub-circuit of the first design and a sub-circuit of the second design that have the same assertions and constraints. The system creates a proof-tree structure including a root-proof, a plurality of parent-proofs downchain of said root-proof and a plurality of child-proofs downchain of at least one of the parent-proofs. Each one of the child-proofs is associated with a first equivalency status of one of the potential equivalent sub-circuit pairs. Each one of the parent-proofs is associated with a second equivalency status. The root-proof is associated with a third functional equivalency status of the first and second circuit designs. The system verifies the child-proofs in parallel and evaluates the first equivalency statuses of the tested child-proofs. The system then updates the second equivalency statuses of the parent-proofs upchain of the tested child-proofs and dependent upon the first equivalency statuses of tested child-proofs. The system finally updates the third equivalency status of the root-proof dependent upon the updated second equivalency statuses of the parent-proofs upchain of the tested child-proofs.

By using the proof-tree structure and verifying the child-proofs parallelly instead of sequentially, the disclosed invention reduces the time needed to verify and optimize circuit designs, thereby drastically reducing cost and time required for a new IC technology to be ready for full-scale production and sale. Therefore, restructuring the original SEC process into the proof-tree structure improves the overall performance of the SEC system and process.

In some embodiments, the system can be configured to convert one of the circuit designs into a mask-level description and fabricate an IC using the mask-level description.

In some embodiments, the system can be configured to dynamically display the proof-tree structure including the plurality of child-proofs with their associated first equivalency statuses, the plurality of parent-proofs with their associated second equivalency statuses, and the root-proof with its associated third equivalency status in an activity viewer.

In some embodiments where the child-proofs downchain of a first parent-proof are abstract logic models, the system can be configured to update the second equivalency status of the first parent-proof when a first equivalency status of at least one of the child-proofs downchain of the first parent-proof is updated.

In some embodiments, the second equivalency status of the first parent-proof is a failure when all of the first equivalency statuses of the child-proofs downchain of the first parent-proof are failures.

In some embodiments, the second equivalency status of the first parent-proof is a failure when at least one of the first equivalency statuses of the child-proofs downchain of the first parent-proof is a failure.

In some embodiments, the system can be further configured to transform a first child-proof into an intermediate-proof associated with a fourth equivalency status, create a second parent-proof downchain of the intermediate-proof, further identify a plurality of new equivalent sub-circuits pairs from the equivalent sub-circuit pair associated with the first child-proof, and creating one or more new child-proofs downchain of the second parent-proof where each one of the created new child-proof is associated with the first equivalency status of one of the new potential equivalent sub-circuit pairs. In such embodiments, the fourth equivalency status of the intermediate-proof is updated dependent upon the second equivalency status of the second parent-proof.

One or more embodiments of the invention or elements thereof can be implemented in the form of a computer product including a non-transitory computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The invention will be described with respect to specific embodiments thereof, and reference will be made to the drawings.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIG. 3 illustrates an update process of a proof-tree with abstract parent-proofs.

FIGS. 4A and 4B illustrate an update process of a proof-tree with non-abstract parent-proofs.

FIGS. 11A, 11B, and 11C depict simplified block diagrams of a computer system suitable for use with embodiments of the technology, as well as circuit design and circuit embodiments of the technology.

Figure 1A:
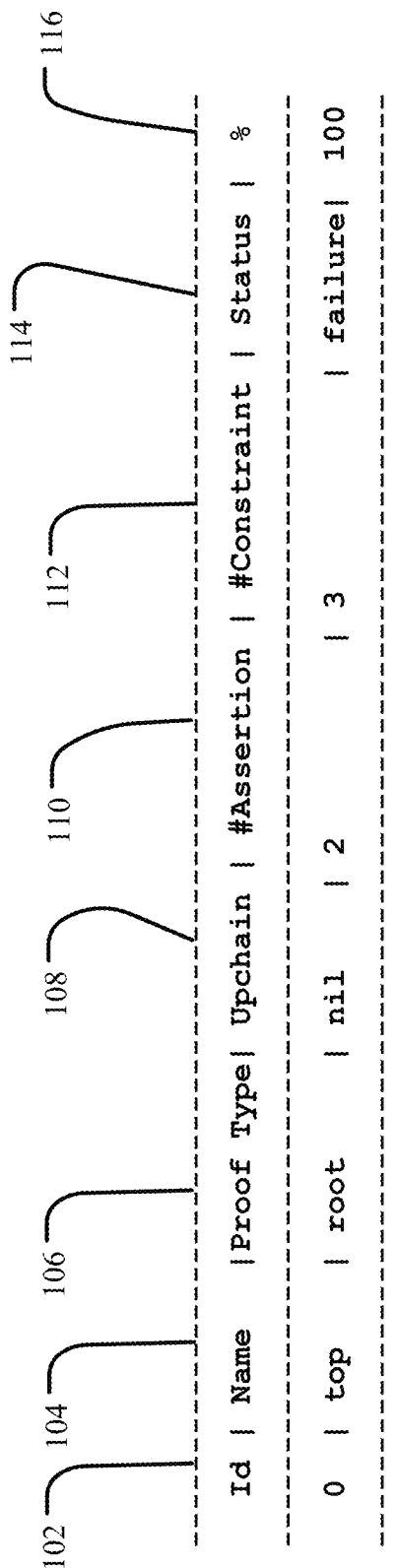
FIGS. 1A and 1B illustrate a first example of a proof-tree structure with only a root-proof.

In such various figures, reference signs may be omitted as is consistent with accepted engineering practice; however, one of ordinary skill in the art will understand that the illustrated components are readily understood when viewed in the context of the illustration as a whole and the accompanying disclosure describing such various figures.

DETAILED DESCRIPTION

The following Detailed Description, Figures, and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale and are part of the Disclosure.

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to enable one or more of the exemplary innovations, embodiments and/or examples. In the interest of not obscuring the presentation of the exemplary innovations, embodiments and/or examples in the following Detailed Description, some processing steps or operations that are known in the art may be combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. Instead, the following description is focused on the distinctive features or elements of various exemplary innovations, embodiments and/or examples. Furthermore, while this description may refer to some components of the structure in the singular tense, more than one component may be depicted throughout the Figures and like components are labeled with like numerals.

Verification of designs is a critical part of the development process for semiconductor chips. A bit-level description of a circuit design utilizes single-bit data elements and is limited to single-bit Boolean operations, such as AND, OR, XOR, NOT, etc. However, in some embodiments, a bit-level description may be written in a form where multiple bit elements are represented by a single symbol, as long as only bit-wise Boolean operations are used, and there is a one-to-one correspondence to a single-bit representation. The bit-level description is typically in a register-transfer level (RTL) description but may be represented in various other forms including Verilog™, SystemVerilog™, VHDL™, C, C++, SystemC, or another computer programming language. Two circuit designs at RTL must be compared and verified against one another. If the two circuit designs are found to be equivalent, then they may be considered verified against each other.

Sequential equivalence checking (SEC) is a paradigm that performs a true sequential check of input/output equivalence of two circuit designs. The outputs of the two circuit designs are added as assertions to be checked during the SEC process. The verification goal of the SEC process is to obtain a trace illustrating an "assertion" of output for given inputs to the circuit designs, or to prove that no such trace exists. Possible values of inputs of the circuit designs may be "constrained" by a previous logic circuit driving the circuit designs in question. Without using these constraints, the circuit designs could have false non-equivalences.

A first and second circuit designs at RTL are verified by using an equivalence checking system. The first and second circuit designs have the same number of constraints and assertions that need to be verified against each other. Structural analysis is used to reduce the circuit designs and partition them into smaller portions for equivalence checking. The analysis includes searching the two circuit designs for multiple potential equivalent sub-circuit pairs where each pair identifies a sub-circuit of the first design and a sub-circuit of the second design between the circuit designs. The sub-circuits of the first and second designs have the same constraints and assertions that need to be verified. The potential equivalent sub-circuit pairs can be identified by their relative position with respect to the time domain (clock cycles), or their position in the space domain of the two circuit designs. Verifications of the multiple potential equivalent sub-circuit pairs determine the equivalence verification of the first and second circuit designs.

The SEC process can have three possible outcomes:

(i) All potential equivalent sub-circuit pairs are verified:
When assertions for all potential equivalent sub-circuit pairs are proven. The statuses of the potential equivalent sub-circuit pairs will help the circuit designer build confidence in the equivalence of the first and second circuit designs.

(ii) Some assertions are failures: When some assertions are failures during the SEC process, the circuit designer can view the list of equivalent sub-circuit pairs that are failing. Therefore, the circuit designer may find it easier to debug a failing equivalent sub-circuit pair as compared to a bigger problem of an equivalence failure of the first and second circuit designs.

(iii) Some assertions are inconclusive: If some of the assertions are inconclusive, the circuit designer may identify the potential equivalent sub-circuit pairs that are still inconclusive.

In the technology disclosed herein, the multiple potential equivalent sub-circuit pairs are arranged in a proof-tree structure. The proof-tree structure is a hierarchical tree structure which includes an arrangement of proofs. The arrangement of proofs includes a root-proof, multiple child-proofs, and multiple parent-proofs. Each one of the child-proofs is associated with a first equivalency status of one of the potential equivalent sub-circuit pairs. Each one of the parent-proofs is associated with a second equivalency status. The root-proof is associated with a third equivalency status of the first and second circuit designs.

The different proofs in the proof-tree structure are "interconnected" with each other in the sense that equivalency statuses of proofs (referred to herein as the "upchain" proofs) are dependent upon other proofs in the proof-tree structure (referred to herein as the "downchain" proofs). A root-proof is upchain to a set of parent-proofs as the third functional equivalency status of the root-proof is dependent upon the second equivalency statuses of the set of parent-proofs. The set of parent-proofs is downchain to the root-proof. Each one of the child-proofs in the proof-tree structure is downchain to a parent-proof (the parent-proof is upchain to the child-proof) as the second functional equivalency status of the parent-proof is dependent upon the first functional equivalency status of the child-proof. The proof-tree structure is adaptable in the sense that new proofs can be created to be added to the proof-tree structure. Because the topology is not restricted in any way, one proof can be both upchain and downchain of another proof. As used herein, one proof is not required to be immediately upchain or downchain of another proof unless such immediacy is specified.

The root-proof of the proof-tree structure is created using the assumptions and constraints for the first and second circuit designs. For the given constraints of the root-proof, the assertions need to be verified. The root-proof is associated with a third functional equivalency status of the first and second circuit designs. A third equivalency status of a root-proof can be a success (all assertions verified), a failure (some assertions failed) or inconclusive (some assertions were inconclusive).

Each child-proof of the proof-tree structure is created using the assumptions and constraints for an equivalent sub-circuit pair. A child-proof is downchain to a parent-proof. A first equivalency status can be a success (all assertions verified), a failure (some assertions failed) or inconclusive (some assertions were inconclusive).

The parent-proofs can be associated with any constraints or assertions. The parent-proofs act as a collector that summarizes the first equivalency statuses of downchain child-proofs. There are three types of parent-proofs:

(i) Abstract parent-proof: The child-proofs downchain of an abstract parent-proof are abstract logic models. The second equivalency status of the abstract parent-proof is dependent upon the first equivalency statuses of the downchain child-proofs. If anyone of the first equivalency statuses of the downchain child-proofs is a success, then the second equivalency status of the abstract parent-proof is a success.

(ii) Non-abstract parent-proof: There is a one-to-one correspondence between the assertions in the downchain child-proofs and the non-abstract parent-proof. If anyone of the first equivalency statuses of the downchain child-proofs is a failure, then the second equivalency status of the non-abstract parent-proof is a failure.

(iii) Intermediate parent-proof: A child-proof can be transformed into an intermediate node when the SEC process needs to create further child-proofs from the original child-proof. The fourth equivalency status of the intermediate parent-proof is determined based on the first equivalency statuses of the child proofs.

During equivalence checking, the child-proofs can be tested and verified in parallel, and the first equivalency statuses of the tested child-proofs can be updated. As used herein, verification is performed "in parallel" in a computing arrangement that allows more than one of the verification processes to be performed at the same time. That is, the verification processes are performed in a manner that overlaps in time. More particularly, verification of one of the processes begins before verification of the other of the processes completes, with neither of the verification processes delaying work while waiting for the other. The equivalence checking system may use a computing arrangement, such as multi-servers, multi-threading, and parallel computing technologies, to thoroughly verify a number of child-proofs simultaneously. In some embodiments, the equivalence checking system is implemented in a High-Performance Computing (HPC) environment that may have dedicated computing nodes and/or computing nodes assigned by an automatic load balancer under the control of the system.

The equivalence checking system then updates the second equivalency statuses of the parent-proofs upchain of the tested child-proofs dependent upon the first equivalency statuses of tested child-proofs. The system finally updates the third equivalency status of the root-proof dependent upon the updated second equivalency statuses of the parent-proofs upchain of the tested child-proofs.

In embodiments, a computer system for the SEC process may comprise: a memory which stores instructions; one or more processors coupled to the memory wherein the one or more processors are configured to perform the technology disclosed herein. In some embodiments, a computer program product embodied in a non-transitory computer readable medium for verification analysis may comprise code for performing the technology disclosed herein. Various features, aspects, and advantages of various embodiments will become more apparent from the following further description.

Figure 1B:
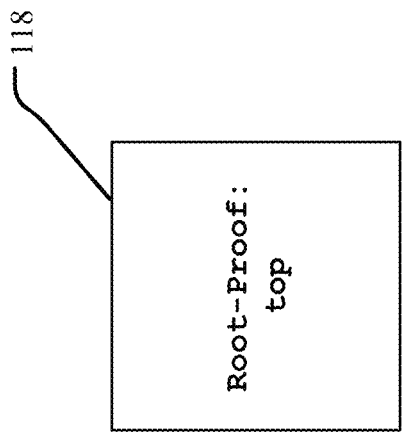

FIGS. 1A and 1B illustrate a first example of a proof-tree structure with only a root-proof. For simple first and second circuit designs, the SEC process may be able to prove the assertions of the first and second circuit designs for the given constraints without breaking the circuit designs into multiple potential equivalent sub-circuit pairs. FIG. 1A is a symbolic drawing indicating how the proof-tree structure database with only a root-proof is organized, according to an embodiment of the invention. As used herein, the term "database" does not necessarily imply any unity of structure. For example, two or more separate databases, when considered together, still constitute a "database" as that term is used herein. As such, the entries defining each single standard cell can also be thought of as a "database." A database can be stored on a hard drive, a storage device or in a memory location or in one or more non-transitory computer readable media. As used herein, no distinction is intended between whether a database is disposed "on" or "in" a computer readable medium. The proof-tree database contains information regarding the various level of proofs. The proof-tree database includes a unique proof ID 102 for each proof, proof's name 104, proof type 106, the name of the upchain proof 108, number of assertions to be verified 110, number of constraints 112, equivalency status of the proof 114 and the percentage of verification completed 116. As shown in FIG. 1A, a root-proof with the name "top" and proof ID 0 has two assertions to be verified for three given constraints. As "top" is a root-proof, there is no proof upchain to "top." The verification of "top" is complete, and the third functional equivalency status is a failure. FIG. 1B illustrates a proof-tree structure with only the root-proof "top" 118.

Figures 2A, 2B:
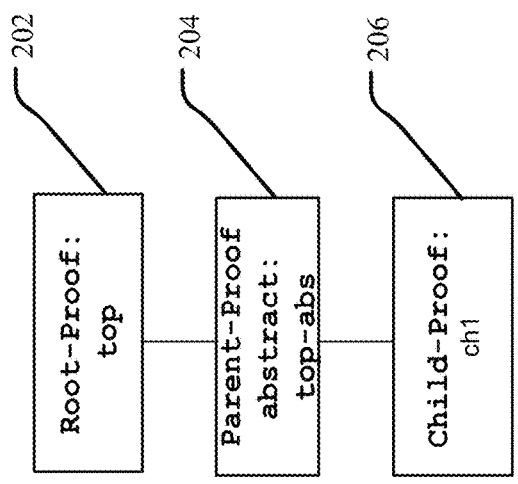
FIGS. 2A, 2B, 2C and 2D illustrate a first example of a proof-tree with abstract parent-proofs

FIG. 2 illustrates an example of a proof-tree with an abstract parent-proof. FIG. 2A is a symbolic drawing indicating how the proof-tree structure is organized, according to an embodiment of the invention. A root-proof with the name "top" and proof ID 0 has two assertions to be verified given three constraints. As "top" is a root-proof, there is no proof upchain to "top." The verification of "top" is incomplete, and the third functional equivalency status is inconclusive. During the execution of the SEC process, a potential equivalent sub-circuit pair is identified, and a child-proof "ch1" is created with proof ID 2 which has 4 assertions and 3 constraints. The child-proof "ch1" is downchain to an abstract parent-proof "top-abs" with proof ID 1. The abstract parent-proof "top-abs" is downchain to the root-proof "top." FIG. 2B illustrates a proof-tree structure for the proof-tree in FIG. 2A. The root-proof "top" 202 is upchain of the parent-proof "top-abs" 204, and the parent-proof "top-abs" 204 is upchain of the child-proof "ch1" 206. The parent-proof "top-abs" 204 is downchain of the root-proof "top" 202, and the child-proof "ch1" 206 is downchain of the parent-proof "top-abs" 204

Figures 2C, 2D:
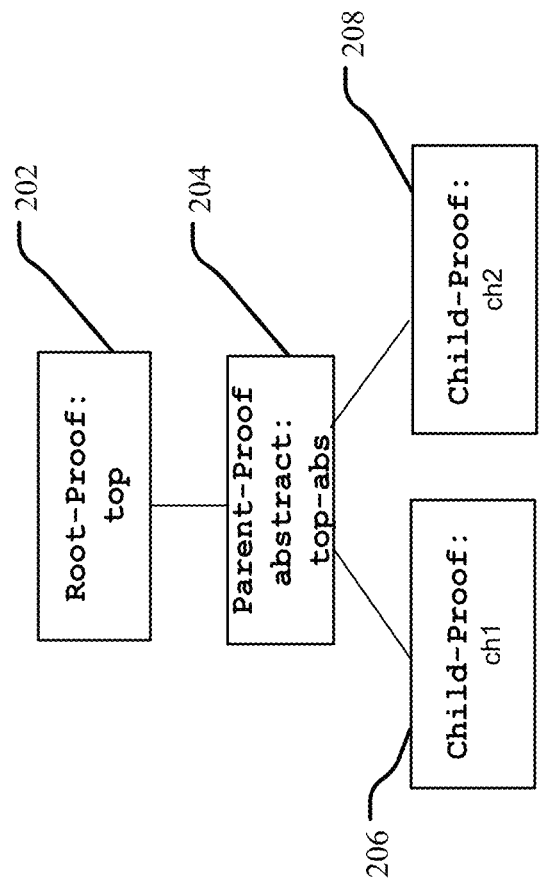

In case the verification of the child-proof "ch1" fails, the SEC process may take further steps to verify the equivalent sub-circuit pair representing the child-proof "ch1". The SEC process may refine the child-proof "ch1" to create a new child-proof "ch2" as shown in FIG. 2C. The new child-proof "ch2" is downchain to the same parent as the previous of the child-proof "ch1". FIG. 2D illustrates a proof-tree structure for the proof-tree in FIG. 2C. The root-proof "top" 202 is upchain of the parent-proof "top-abs" 204, and the parent-proof "top-abs" 204 is upchain of the child-proof "ch1" 206 and the child-proof "ch2" 208.

If the assertions of the child-proof "ch2" are verified to be equivalent, the first equivalency status of the child-proof "ch2" is updated to reflect a success as shown in FIG. 3. The SEC process also updates the second equivalency status of the parent-proof "top-abs" to be a success, and the third equivalency status of the root-proof "top" to be a success.

FIG. 4 illustrates an update process of a proof-tree with non-abstract parent-proofs. FIG. 4A is a symbolic drawing indicating how the proof-tree structure is organized, according to an embodiment of the invention. A root-proof with the name "top" and proof ID 0 has two assertions to be verified given three constraints. As "top" is a root-proof, there is no proof upchain to "top." During the execution of the SEC process, the original assertions are split into two proofs. A child-proof "ch1" is created with proof ID 2 which has 1 assertion and 3 constraints for one of the original assertion. A child-proof "ch2" is created with proof ID 3 which has 1 assertion and 3 constraints for the other original assertion. The child-proof "ch1" and the child-proof "ch2" are downchain of the non-abstract parent-proof "top-nabs" with proof ID 1. If both the child-proof "ch2" and the child-proof "ch1" are verified to the equivalent, and their first equivalency statuses are updated to be successes, the second equivalency status of the parent-proof "top-nabs" is also updated to be a success. Accordingly, the third equivalency status of the root-proof "top" is updated to be a success.

If either of the child-proof "ch2" and the child-proof "ch1" are verified to be not equivalent and their first equivalency status is updated to be a failure, the second equivalency status of the parent-proof "top-nabs" is also updated to be a failure as shown in FIG. 4B. Accordingly, the third equivalency status of the root-proof "top" is updated to be a failure.

Figure 5A:
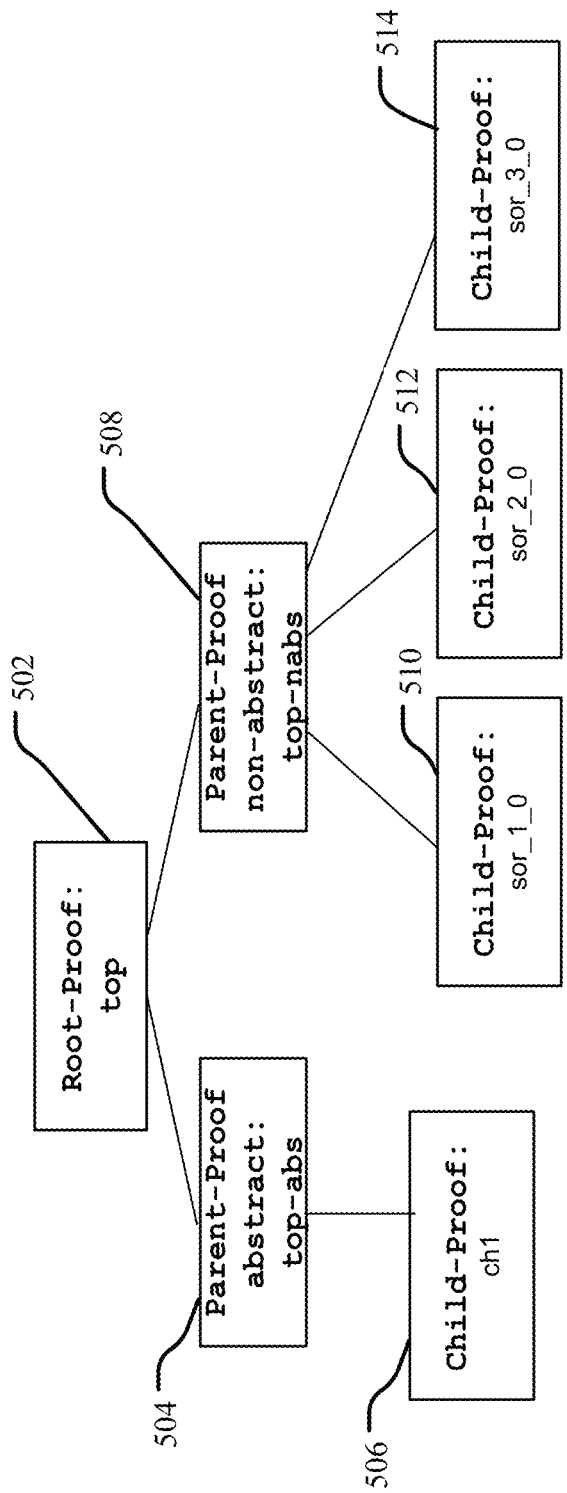
FIGS. 5A and 5B illustrate an update process of a proof-tree with intermediate parent-proofs.
Figure 5B:
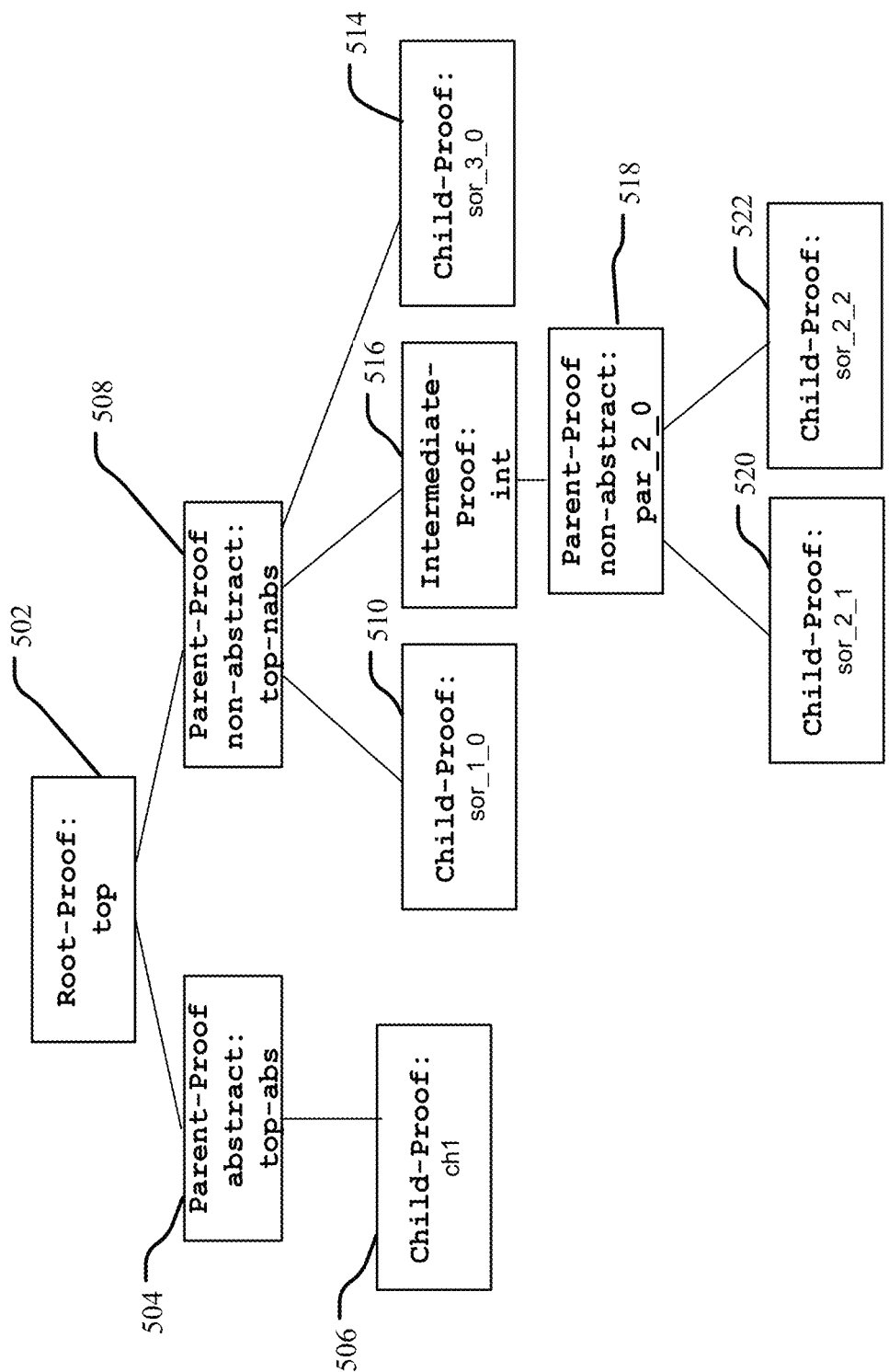

FIG. 5 illustrates the creation of an intermediate parent-proof in a proof-tree. FIG. 5A illustrates a proof-tree structure with a root-proof "top" 502. The root-proof "top" 502 is upchain of the abstract parent-proof "top-abs" 504, and the non-abstract parent-proof "top-nabs" 508. The abstract parent-proof "top-abs" 504 is upchain of the child-proof "ch1" 506. The non-abstract parent-proof "top-nabs" 508 is upchain to the child-proof "sor_1_0" 510, the child-proof "sor_2_0" 512, and the child-proof "sor_3_0" 514. The SEC process may need to create further child-proofs from an original child-proof. The SEC process may identify a plurality of new equivalent sub-circuits pairs from the equivalent sub-circuit pair associated with the original child-proof. The SEC process transforms the original child-proof into an intermediate-proof, creates a second parent-proof downchain of the intermediate-proof associated with a fourth equivalency status, and creates one or more new child-proofs downchain of the second parent-proof where each one of the created new child-proof is associated with the first equivalency status of one of the new potential equivalent sub-circuit pairs. In such embodiments, the fourth equivalency status of the intermediate-proof is updated dependent upon the second equivalency status of the second parent-proof. In FIG. 5B, the child-proof "sor_2_0" 512 in FIG. 5A is replaced with the intermediate-proof "int" 516. A new non-abstract parent-proof "par_2_0" 518 is created downchain of the intermediate-proof "int" 516. Two new equivalent sub-circuits pairs are identified and two new child-proofs, a child-proof "sor_2_1" 520 and a child-proof "sor_2_2" 522, are created downchain of the non-abstract parent-proof "par_2_0" 518. If anyone of the first equivalency statuses of the new downchain child-proofs is a failure, then the fourth equivalency status of the intermediate parent-proof is a failure.

Figure 6:
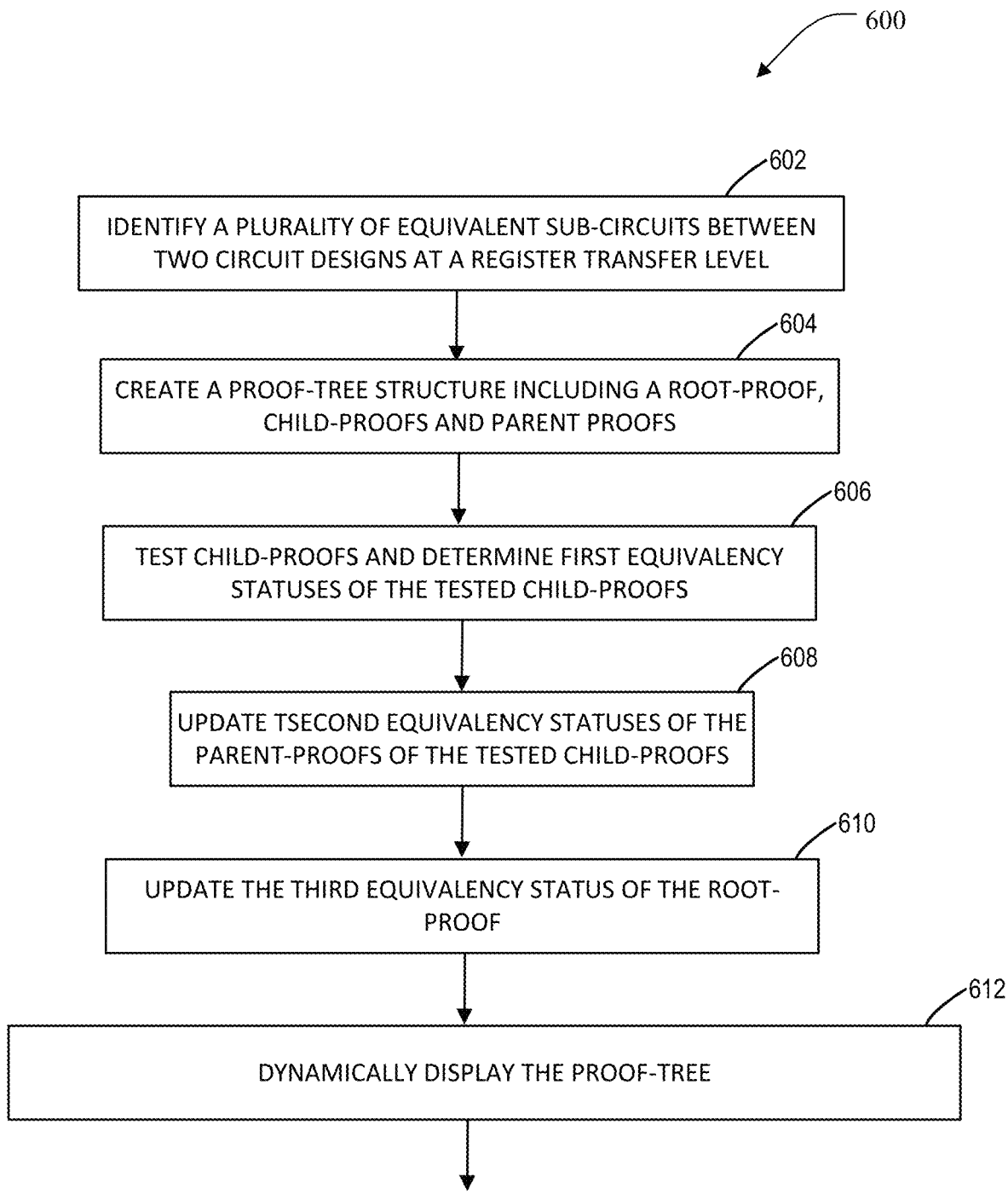
FIG. 6 illustrates a flowchart of a sequential equivalence checking process of first and second circuit designs at a register transfer level in accordance with an embodiment of the present disclosure.

FIG. 6 illustrates a flowchart of the process of sequential equivalence checking of first and second circuit designs at a register transfer level in accordance with an embodiment of the present disclosure.

Flowchart 600 can be performed by the steps illustrated in FIG. 6. Other implementations may perform the steps in different orders and/or with different, fewer or additional steps than those illustrated in FIG. 6. Multiple actions can be combined in some implementations. For convenience, this flowchart is described with reference to the proof-tree structure in FIG. 2D.

The method described in this section and other sections of the technology disclosed can include one or more of the following features and/or features described in connection with additional methods disclosed. In the interest of conciseness, the combinations of features disclosed in this application are not individually enumerated and are not repeated with each base set of features. The reader will understand how features identified in this method can readily be combined with sets of base features identified as implementations.

FIG. 6 includes a process 600 that begins at step 602, where a plurality of potential equivalent sub-circuit pairs at a register transfer level is identified from the first and second circuit designs. Each pair identifies with a sub-circuit of the first design and a sub-circuit of the second design between the circuit designs.

Process 600 continues at step 604 where creates a proof-tree structure including a root-proof, a plurality of parent-proofs downchain of said root-proof and a plurality of child-proofs downchain of at least one of the parent-proofs. Each one of the child-proofs is associated with a first equivalency status of one of the potential equivalent sub-circuit pairs. Each one of the parent-proofs is associated with a second equivalency status. The root-proof is associated with a third functional equivalency status of the first and second circuit designs. An example proof-tree structure is the one illustrated in FIG. 2D. The root-proof "top" 202 is upchain of the parent-proof "top-abs" 204, and the parent-proof "top-abs" 204 is upchain of the child-proof "ch1" 206 and the child-proof "ch2" 208.

At step 606, the child-proofs (the child-proof "ch2" 206 and the child-proof "ch2" 208 in FIG. 2D) are verified in parallel, and the first equivalency statuses of the tested child-proofs are evaluated.

At step 608, The second equivalency statuses of the parent-proofs upchain of the tested child-proofs are updated dependent upon the first equivalency statuses of tested child-proofs. In the case of the proof-tree structure in FIG. 2D, the second equivalency status of the parent-proof "top-abs" 204 is updated.

At step 610, the third equivalency status of the root-proof is updated dependent upon the updated second equivalency statuses of the parent-proofs upchain of the tested child-proofs. In the case of the proof-tree structure in FIG. 2D, the third equivalency status of the root-proof "top" 202 is updated.

At step 612, the updated proof-tree structure can be dynamically displayed in an activity viewer.

An activity viewer can help a circuit designer visualize the proof-tree structure and/or provide information about the verification process. Since the child-proofs can be an abstraction of the root-proof, the equivalency status of the root-proof is dependent upon the equivalency statuses of the child-proof. The activity viewer may have information for each child-proof and parent-proof in the proof-tree structure. The activity viewer may also provide overall status of the verification of the root-proof, without providing information about the child-proofs. The activity viewer may also provide information/statuses about the potential equivalent sub-circuit pairs between the two circuit designs.

Figure 7:
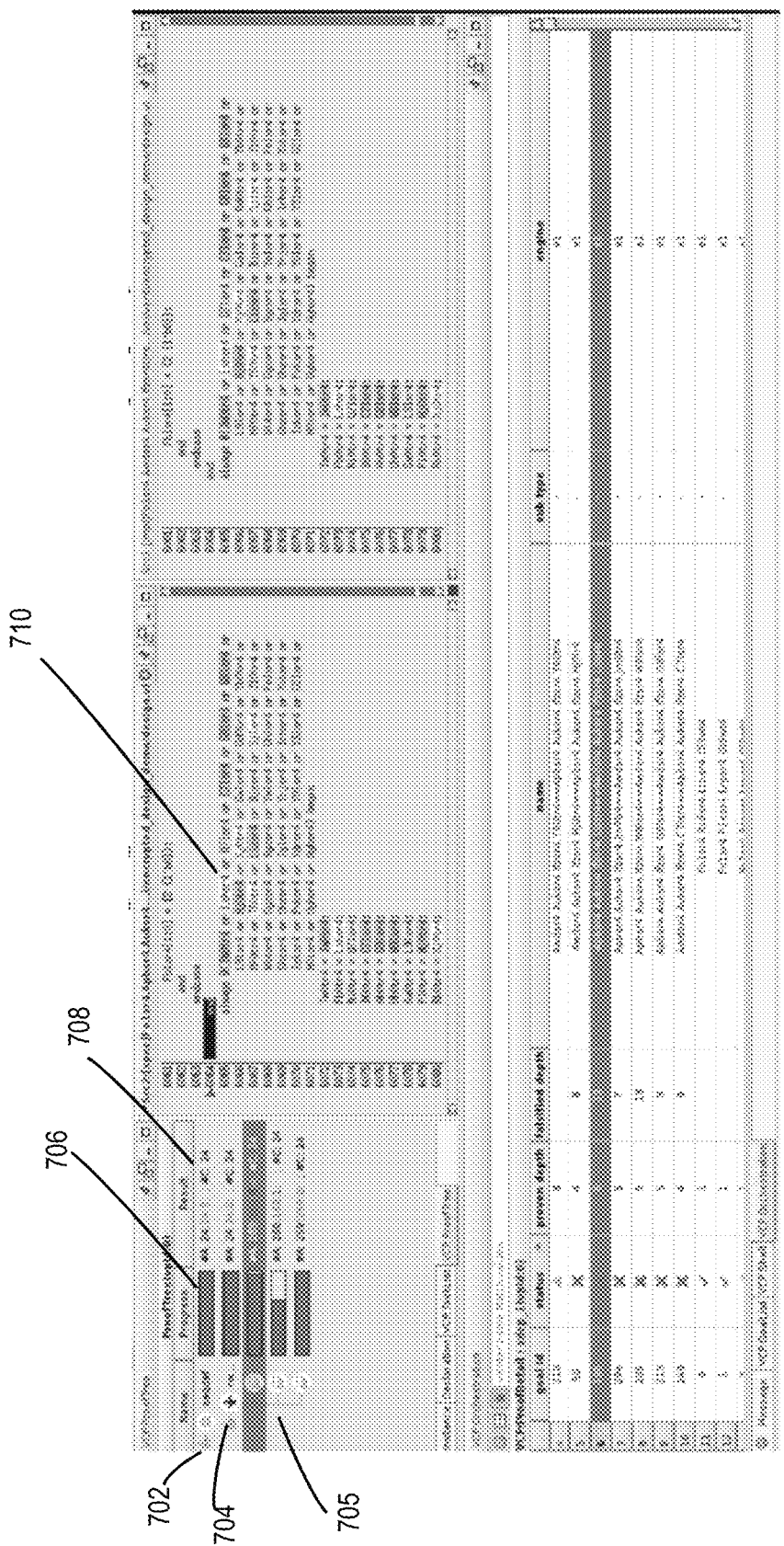
FIG. 7 illustrates a first example activity viewer dynamically displaying the process of sequential equivalence checking of two circuit design with a proof-tree structure.

FIG. 7 illustrates a first example activity viewer dynamically displaying the sequential equivalence checking of two circuit designs with a proof-tree structure. The first example activity viewer illustrates a proof-tree with the root-proof 702, a parent-proof 704 and three child-proofs 705. The first example activity viewer also illustrates some of the associated properties of the proofs, such as the verification progress bar of each proof 706, number of constraints and assumptions 708, and the equivalency status. The first example activity viewer may indicate which proof is being actively verified. The equivalence status of the proof can be indicated in different colors; such can green for success, yellow for inconclusive and red for failure. The proof-tree structure can be expanded or collapsed. The proofs in the first example activity viewer may be updated automatically when a verification progress of any of the proof increases or the equivalency status of any of the proof is updated.

Mapped assertion signals of a child-proof can be shown in a source browser 710. The mapped signals can be a success (marked in green), a failure (marked in red) or inconclusive (marked in yellow).

Figure 8:
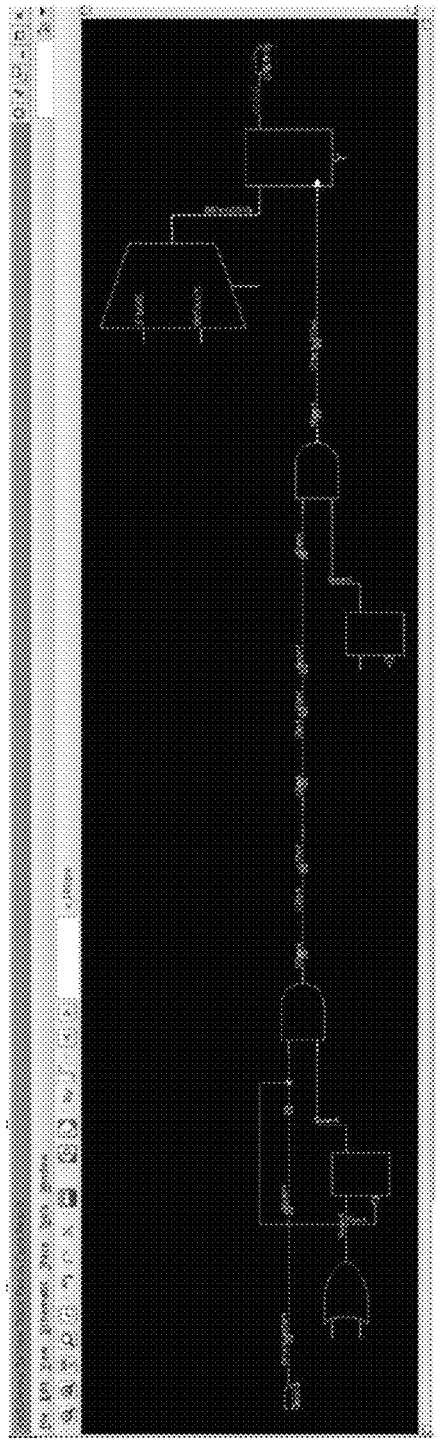
FIG. 8 illustrates a second example activity viewer displaying one of the sub-circuit of an equivalent sub-circuit pair.

FIG. 8 illustrates a second example activity viewer displaying a schematic view of one of the sub-circuit of a potential equivalent sub-circuit pair. The status of the potential equivalent sub-circuit pair in the second example activity viewer can be a success (marked in green), a failure (marked in red) or inconclusive (marked in yellow). The second activity viewer helps a circuit designer in debugging a logic design.

Figure 9A:
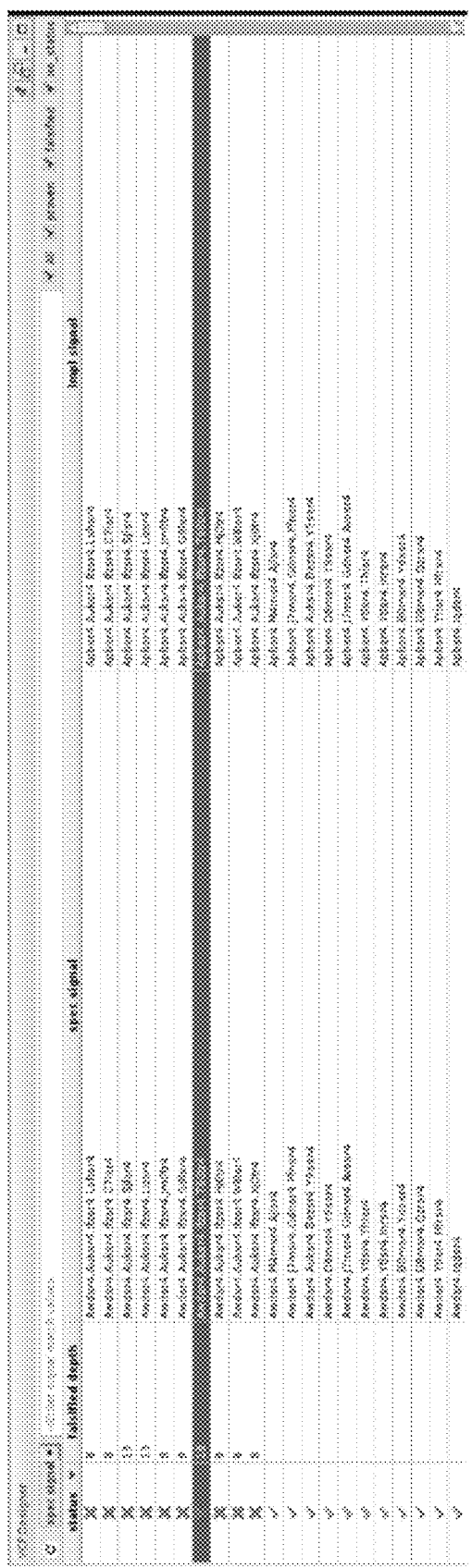
FIGS. 9A and 9B illustrate a third example activity viewer dynamically displaying a proof-tree.
Figure 9B:
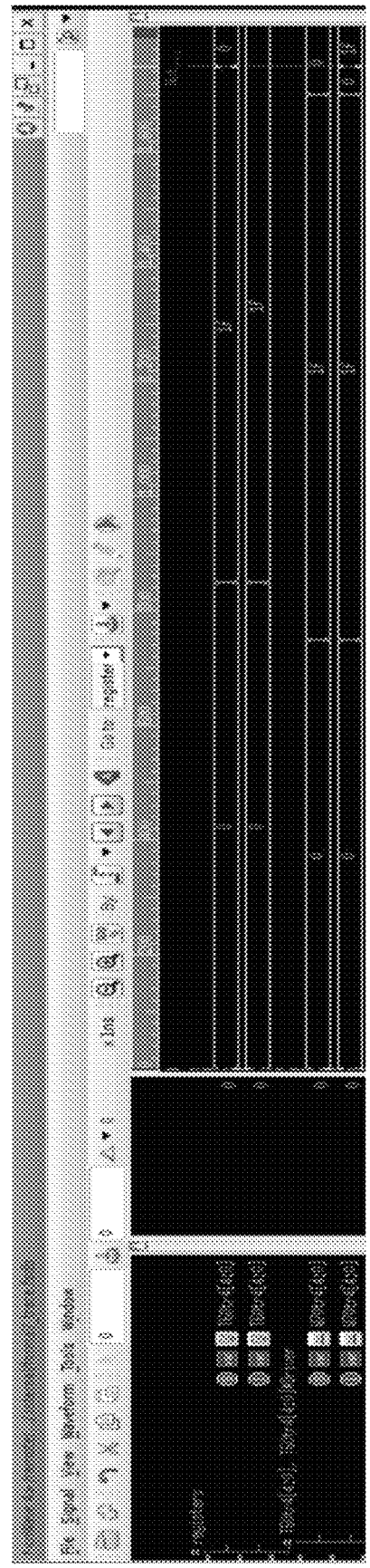

FIG. 9 illustrates a third example activity viewer that provides status about the circuit designs. The third example activity viewer may provide information/statuses about the equivalent sub-circuit pair between the two circuit designs, illustrate the status of the equivalent sub-circuit pair in a property table as shown in FIG. 9A and illustrate the status of the equivalent sub-circuit pair in a waveform viewer as shown in FIG. 9B. The third example activity viewer can provide counter-example traces for debugging the differences of these equivalent sub-circuit pairs.

EDA System/Workflow Explanation

Figure 10:
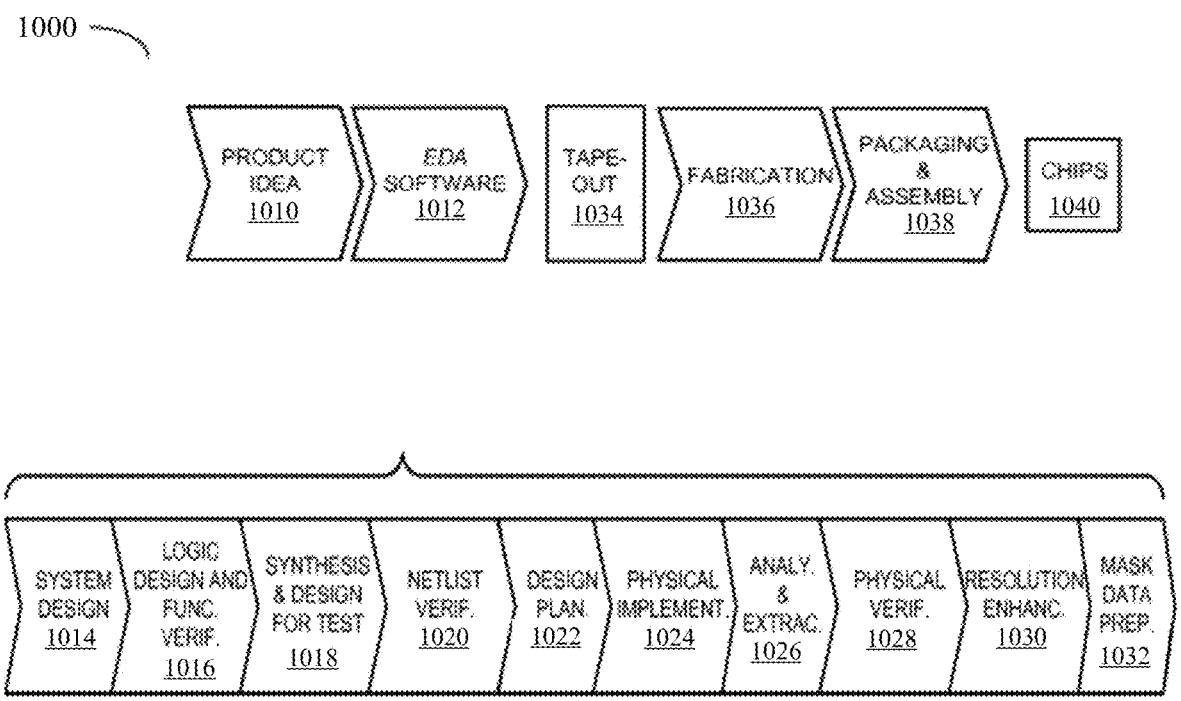
FIG. 10 depicts a flowchart of various operations in the design and fabrication of an integrated circuit in accordance with an embodiment of the present disclosure.

FIG. 10 illustrates various processes 1000 performed in the design, verification, and fabrication of an item of manufacture such as an integrated circuit using software tools with a computer, and possibly special hardware-assisted tools, to transform and verify design data and instructions that represent the integrated circuit. These processes start with the generation of a product idea 1010 with information supplied by a designer, information which is transformed during a process to create an item of manufacture (referred to herein as a design or device) that uses an EDA software tool 1012, which may also be signified herein as EDA software, as a design tool, or a verification tool. When the design is finalized, it can be taped-out 1034, which typically is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed, which result in the finished integrated circuit 1040 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses an EDA software tool 1012 includes processes 1014-1032, which are described below. This design flow description is for illustration purposes only and is not meant to limit the present disclosure. For example, an actual integrated circuit design may require a designer to perform the design operations in a different sequence than the sequence described herein.

During system design 1014, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and Designware products.

During logic design and functional verification 1016, modules in the circuit are specified in one or more hardware description languages or HDLs, and the design in HDL is checked for functional accuracy, that is, to match the requirements of the specification of the circuit or system being designed to ensure that the design produces the correct outputs. Exemplary HDL languages are Verilog, VHDL, and SystemC. Functional verification is typically done by using software-based simulators and other tools such as testbench generators, static HDL checking tools, and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, Designware, Magellan, Formality, ESP, and Leda products. Exemplary emulator and prototyping products also available from Synopsys that can be used at this state include: Zebu® and Protolink® (RTM="Registered Trademark"). The technology described herein can be performed in this module.

During synthesis and design for test 1018, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and Designware products.

During netlist verification 1020, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 1022, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 1024, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 1026, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 1028, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 1030, geometric manipulations of the layout are performed to improve manufacturability of the design. Exemplary EDA software products from Synopsys, Inc. of Mountain View, Calif. that can be used at this stage include: *Proteus* products.

During tape-out, data is created to be used (after lithographic enhancements are applied if appropriate) for production of lithography masks. Example EDA software products from Synopsys, Inc. that can be used during tape-out include the IC Compiler and Custom Designer families of products.

During mask-data preparation 1032, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 1012.

A storage subsystem is preferably used to store the programs and data structures that provide the functionality of some or all of the EDA tools described herein, and tools applied for the sequential equivalence checking of two or more circuit designs. These programs and data structures are generally executed by one or more processors in a manner known to those of ordinary skill in the art.

General Computer Explanation

FIGS. 11A, 11B, and 11C are simplified block diagrams of a computer system suitable for use with embodiments of the technology, as well as circuit design and circuit embodiments of the technology.

In FIG. 11A, computer system 1110 typically includes at least one computer or processor 1114 which communicates with a number of peripheral devices via bus subsystem 1112. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 1124, comprising a memory subsystem 1126 and a file storage subsystem 1128, user interface input devices 1122, user interface output devices 1120, and a network interface subsystem 1116. The input and output devices allow user interaction with computer system 1110.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted "blade", a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems' Solaris, Apple Computer's MacOs, Linux or Unix. The computer system also typically can include a Basic Input/Output System (BIOS) and processor firmware. The operating system, BIOS, and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 1124 to perform any one or more of the sets of instructions discussed herein. Due to the ever-changing nature of computers and networks, the description of computer system 1110 depicted in FIG. 11A is intended only as one example for purposes of illustrating the preferred embodiments. Many other configurations of computer system 1110 are possible having more or less components than the computer system depicted in FIG. 11A.

Network interface subsystem 1116 provides an interface to outside networks, including an interface to the communication network 1118, and is coupled via communication network 1118 to corresponding interface devices in other computer systems or machines. Communication network 1118 may comprise many interconnected computer systems, machines and communication links. These communication links may be wireline links, optical links, wireless links, or any other devices for communication of information. The communication network 1118 can be any suitable computer network, for example, a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1122 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term "input device" is intended to include all possible types of devices and ways to input information into computer system 1110 or onto communication network 1118. User interface input devices typically allow a user to select objects, icons, text and the like that appear on some types of user interface output devices, for example, a display subsystem.

User interface output devices 1120 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 1110 to the user or to another machine or computer system. The display subsystem may display an activity viewer disclosed herein to a circuit designer.

Memory subsystem 1126 typically includes a number of memories including a main random-access memory (RAM) 1130 (or other volatile storage devices) for storage of instructions and data during program execution and a read-only memory (ROM) 1132 in which fixed instructions are stored. File storage subsystem 1128 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1128.

Bus subsystem 1112 provides a device for letting the various components and subsystems of computer system 1110 communicate with each other as intended. Although bus subsystem 1112 is shown schematically as a single bus, alternative embodiments of the bus subsystem may use multiple busses. For example, RAM-based main memory can communicate directly with file storage systems using Direct Memory Access (DMA) systems.

FIG. 11B depicts a memory 1140 such as a non-transitory, computer readable data, and information storage medium associated with file storage subsystem 1128, and/or with network interface subsystem 1116, and can include a data structure specifying a circuit design. The memory 1140 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 11C signifies an integrated circuit 1190 created with the described technology that includes one or more cells selected, for example, from a cell library.

Emulation Environment Explanation

Figure 12:
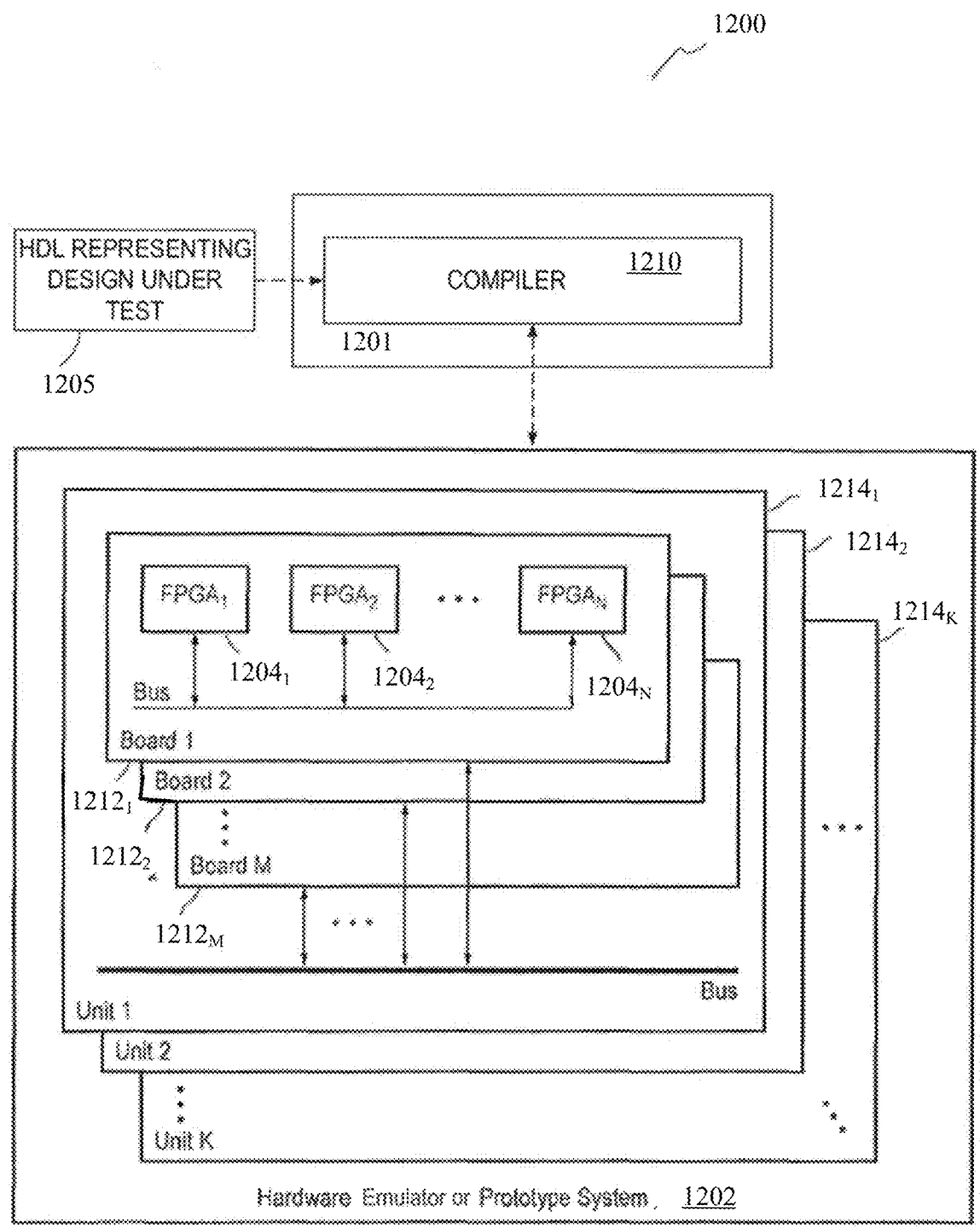
FIG. 12 depicts a block diagram of an emulation system.

An EDA software system, such as element 1012 depicted in FIG. 10 typically includes an emulation system 1016 to verify the functionality of the circuit design. FIG. 12 depicts a typical emulation system which includes a host computer system 1201 (often part of an EDA system) and an emulator system 1202 (typically a set of programmable devices such as Field Programmable Gate Arrays (FPGAs)). The host system generates data and information, typically using a compiler 1210, to configure the emulator to emulate a circuit design. One of more circuit designs to be emulated is referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 1201 comprises one or more processors. In the embodiment where the host system is comprised of multiple processors, the functions described herein as being performed by the host system may be distributed among the multiple processors.

The host system 1201 typically includes a compiler 1210 that processes code written in a hardware description language that represents a DUT, producing data (typically binary) and information that is used to configure the emulation system 1202 to emulate the DUT. The compiler 1210 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1204_1$ to $1204_N$ in FIG. 12. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1204_1$-$1204_N$ may be placed into one or more hardware boards $1212_1$ through $1212_M$. Many of such boards may be placed into a hardware unit, e.g., $1214_1$. The boards within a unit may be connected using the backplane of the unit or any other types of connections. In addition, multiple hardware units (e.g., $1214_1$ through $1214_K$) may be connected to each other by cables or any other means to form a multi-unit system. In general, the hardware emulation or prototype system 1202 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 1201 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in an HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can store the emulation results or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or all together. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by the logic of the identified FPGAs during the re-emulation of the component. The host system stores the signals received from the emulator. The signals traced during the re-emulation can have a higher sampling rate than during the initial emulation. For example, in the initial run, a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterward, the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1210 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states, and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by the logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into the logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA, and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/reemulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilink or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments, and examples described in this specification. Such devices configurable by the software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Semantic Support

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract' } how the commercial solution differs from equivalent prior art solutions; or b) a new commercial solution is 'abstract' if it is obvious, that is, if the existing prior art includes at least one analogous prior art solution {see KSR} or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description, it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example, any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. A system for performing sequential equivalence checking of first and second circuit designs at a register transfer level, the system comprising a memory and a data processor coupled to the memory, the data processor configured to:
   identify a plurality of sub-circuit pairs at a register transfer level, each pair identifying a sub-circuit of the first design and a sub-circuit of the second design to be proved functionally equivalent to the sub-circuit of the first design;
   create a proof-tree structure, the proof-tree structure including a root-proof, a plurality of parent-proofs downchain of said root-proof and a plurality of child-proofs downchain of at least one of the parent-proofs, each of the child-proofs having an equivalency status of a respective one of the sub-circuit pairs, each of the parent-proofs having an equivalency status, and the root-proof having an equivalency status being an equivalency status of the first and second circuit designs;
   test at least two of the child-proofs in parallel and determine the equivalency status of each of the tested child-proofs;
   update the equivalency statuses of the parent-proofs upchain of the tested child-proofs in dependence upon the equivalency statuses of tested child-proofs; and
   update the equivalency status of the root-proof in dependence upon the updated equivalency statuses of the parent-proofs upchain of the tested child-proofs.

2. The system of claim 1 further configured to convert one of the circuit designs into a mask-level description.

3. The system of claim 2 further configured to fabricate an integrated circuit using the mask-level description.

4. The system of claim 1 configured to test the child-proofs and update the parent-proofs until the equivalency status of the root-proof can be determined, and then updating the equivalency status of the root-proof.

5. The system of claim 4, further configured to:
   display in an activity viewer equivalency statuses of at least a subset of the child-proofs, and at least a subset of the parent-proofs, and the root-proof; and
   update the displayed activity statuses dynamically during the steps of testing the child-proofs and updating the parent-proofs until the equivalency status of the root-proof can be determined.

6. The system of claim 1, wherein child-proofs downchain of a first parent-proof are abstract logic models.

7. The system of claim 6, wherein the system is configured to update the equivalency status of the first parent-proof to indicate a success, in response to determining that the equivalency status of one of the child-proofs downchain of the first parent-proof is a success.

8. The system of claim 6, wherein the system is configured to update the equivalency status of the first parent-proof to indicate a failure, only in response to determining that the equivalency statuses all of the child-proofs immediately downchain of the first parent-proof are failures.

9. The system of claim 1, wherein the system is configured to update the equivalency status of a parent-proof to indicate a success, in response to determining that the the equivalency statuses all of the child-proofs immediately downchain of the parent-proof are successes.

10. The system of claim 1 further configured to:
    identify a plurality of new sub-circuits pairs from the sub-circuit pair of a first one of the child-proofs;
    transform the first child-proof into an intermediate-proof;
    create a second parent-proof downchain of the intermediate-proof, the second parent-proof having an equivalency status; and
    create a plurality of new child-proofs downchain of the second parent-proof, each one of the new child-proofs having an equivalency status of a respective one of the new sub-circuit pairs,
    wherein the equivalency status of the intermediate-proof is updated in dependence upon the equivalency status of the second parent-proof.

11. A method for performing sequential equivalence checking of first and second circuit designs at a register transfer level, comprising:
    a computer system identifying a plurality of sub-circuit pairs at a register transfer level, each pair identifying a sub-circuit of the first design and a sub-circuit of the second design to be proved functionally equivalent to the sub-circuit of the first design;
    a computer system creating a proof-tree structure, the proof-tree structure including a root-proof, a plurality of parent-proofs downchain of said root-proof and a plurality of child-proofs downchain of at least one of the parent-proofs, each of the child-proofs having an equivalency status of a respective one of the sub-circuit pairs, each of the parent-proofs having an equivalency status, and the root-proof having an equivalency status being an equivalency status of the first and second circuit designs;
a computer system testing at least two of the child-proofs in parallel and determine the equivalency status of each of the tested child-proofs;
a computer system updating the equivalency statuses of the parent-proofs upchain of the tested child-proofs in dependence upon the equivalency statuses of tested child-proofs; and
a computer system updating the equivalency status of the root-proof in dependence upon the updated equivalency statuses of the parent-proofs upchain of the tested child-proofs.

12. The method of claim 11, further comprising converting one of the circuit designs into a mask-level description.

13. The method of claim 12, further comprising converting fabricating an integrated circuit using the mask-level description.

14. The method of claim 11, further comprising testing the child-proofs and update the parent-proofs until the equivalency status of the root-proof can be determined, and then updating the equivalency status of the root-proof.

15. The method of claim 14, further comprising:
displaying in an activity viewer equivalency statuses of at least a subset of the child-proofs, and at least a subset of the parent-proofs, and the root-proof; and
updating the displayed activity statuses dynamically during the steps of testing the child-proofs and updating the parent-proofs until the equivalency status of the root-proof can be determined.

16. The method of claim 11, wherein child-proofs downchain of a first parent-proof are abstract logic models.

17. The method of claim 16, further comprising updating the equivalency status of the first parent-proof to indicate a success, in response to determining that the equivalency status of one of the child-proofs downchain of the first parent-proof is a success.

18. The method of claim 16, further comprising updating the equivalency status of the first parent-proof to indicate a failure, only in response to determining that the equivalency statuses all of the child-proofs immediately downchain of the first parent-proof are failures.

19. The method of claim 11, further comprising updating the equivalency status of a parent-proof to indicate a success, in response to determining that the the equivalency statuses all of the child-proofs immediately downchain of the parent-proof are successes.

20. The method of claim 11, further comprising:
identifying a plurality of new sub-circuits pairs from the sub-circuit pair of a first one of the child-proofs;
transforming the first child-proof into an intermediate-proof;
creating a second parent-proof downchain of the intermediate-proof, the second parent-proof having an equivalency status; and
creating a plurality of new child-proofs downchain of the second parent-proof, each one of the new child-proofs having an equivalency status of a respective one of the new sub-circuit pairs,
wherein the equivalency status of the intermediate-proof is updated in dependence upon the equivalency status of the second parent-proof.

\* \* \* \* \*

UNITED STATES PATENT AND TRADEMARK OFFICE
CERTIFICATE OF CORRECTION

PATENT NO. : 10,515,170 B1  
APPLICATION NO. : 16/034279  
DATED : December 24, 2019  
INVENTOR(S) : Sudipta Kundu et al.

Page 1 of 1

It is certified that error appears in the above-identified patent and that said Letters Patent is hereby corrected as shown below:

In the Claims

At Column 26, Claim 9, Line 37, after "that the" delete "the".

At Column 28, Claim 19, Line 15, after "that the" delete "the".

Signed and Sealed this  
Third Day of March, 2020

Andrei Iancu  
*Director of the United States Patent and Trademark Office*